United States Patent
Freidhof

(10) Patent No.: US 6,518,894 B2
(45) Date of Patent: Feb. 11, 2003

(54) DEVICE AND METHOD FOR SAMPLING RATE CONVERSION

(75) Inventor: Markus Freidhof, Taufkirchen (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 0 days.

(21) Appl. No.: 10/072,894

(22) Filed: Feb. 12, 2002

(65) Prior Publication Data

US 2002/0109617 A1 Aug. 15, 2002

(30) Foreign Application Priority Data

Feb. 12, 2001 (DE) ......................... 101 06 403

(51) Int. Cl.$^7$ ............................................. H03M 7/00
(52) U.S. Cl. ............................................. 341/61; 341/50
(58) Field of Search ........................... 341/61, 50

(56) References Cited

U.S. PATENT DOCUMENTS

| 4,953,117 A | 8/1990 | Lagadec |
|---|---|---|
| 5,451,944 A | 9/1995 | Sogo |
| 5,617,088 A | 4/1997 | Yasuda |
| 6,057,789 A | 5/2000 | Lin |
| 6,061,410 A | 5/2000 | Linz |
| 6,411,225 B1 * | 7/2002 | Van Den Enden ............ 341/61 |

FOREIGN PATENT DOCUMENTS

| DE | 101 02 166 A1 | 8/2002 |
|---|---|---|
| EP | 0 665 546 A2 | 8/1995 |

* cited by examiner

Primary Examiner—Brian Young
(74) Attorney, Agent, or Firm—Birch, Stewart, Kolasch & Birch, LLP

(57) ABSTRACT

A resampler device and method are used to convert a digital input signal string ($S_{in}$) with an input-sampling rate into a digital output signal string ($S_{out}$) with a higher output-sampling rate. Prior to interpolation, a time shift ($t_{mod}(n)/T_{out}$) is first determined for every sampling time ($t'_n$) of the output signal string ($s_{out}$) relative to a next sampling time ($t_{i+1}$) of the input signal string ($s_{in}$). Then the time shift ($\Delta t(n)/T_{out}$) of the sampling time ($t'_n$) of the output signal string ($S_{out}$) relative to the preceding sampling time ($t_i$) of the input signal string ($S_{in}$) is determined from the previously determined time shift ($t_{mod}(n)/T_{out}$) relative to the next sampling time ($t_{i+1}$).

11 Claims, 6 Drawing Sheets

DEVICE AND METHOD FOR SAMPLING RATE CONVERSION

BACKGROUND OF THE INVENTION

This application claims a foreign priority from German patent application no. 101 06 403.9, filed Feb. 12, 2001, and the contents of that application are incorporated by reference herein.

The invention concerns a device for converting a digital input signal string having an input-sampling rate into a digital output signal string having an output-sampling rate that is higher than the input-sampling rate. Such a device is generally called a resampler. The increase in the sampling rate is called up-sampling. The invention also relates to a corresponding method.

A resampler for down-sampling is known from European patent document EP 0 665 546 A2, for example. In a resampler, a relationship between the input-sampling rate and the output-sampling rate must first be determined. In the aforementioned document, this is accomplished through a gate time measurement. The sampled values for the output sample times specified by the output-sampling rate are interpolated in an interpolator from the input signal string. In this regard, the interpolator is controlled by a detected sampling rate ratio. Since determination of the sampling rate ratio is subject to measuring inaccuracy, buffering takes place in a buffer store, for example a FIFO, at the output of the interpolator in the case of down-sampling and at the input of the interpolator in the case of up-sampling. In this context, the integral behavior of the FIFO memory is exploited. EP 0 665 546 A1 proposes regulating the sampling rate ratio that controls the interpolator as a function of the fill level, or condition, of the buffer store.

The regulation of the sampling rate ratio (relationship) as a function of the fill level of the buffer store proposed in EP 0 665 546 A2 has the disadvantage that when the fill level of the buffer store changes, a group propagation delay of the digital signal through the resampler changes. In an application, such as in mobile radio telephony, larger changes in buffer store fill level (e.g. +/−1), that is a change by one storage unit, are not tolerable since they lead to variations in propagation delay of the signal through the resampler. With the buffer store fill level controller proposed in EP 0 665 546 A1, deviations in a clock rate ratio are detected relatively late, after a relatively large detuning of the ratio has already taken place. This leads to relative large interpolation errors due to incorrect sampling times. Up-sampling is not possible with this resampler without further measures.

A resampler for down-sampling is described in the not-published German patent document DE 101 02 166 A1 by the same inventor and the same assignee. Conversion from the down-sampling described in this document to up-sampling is not possible without the knowledge contained in the present invention.

It is an object of this invention is to provide a device (resampler) and a method (resampling method) for the conversion of a digital input signal string with an input-sampling rate into a digital output signal string with a higher output-sampling rate, which device and/or method functions with high precision and can be implemented with limited expense.

SUMMARY OF THE INVENTION

The object is attained with regard to the device through the features of claim 1, and with regard to the method through the features of claim 9. The dependent claims contain advantageous refinements of the device and/or the method.

BRIEF DESCRIPTION OF THE DRAWINGS

An embodiment of each of the resampler and the resampling method of this invention is described below in detail with reference to the drawings. In the drawings.

DETAILED DESCRIPTION OF THE INVENTION

Before an embodiment of a resampler of this invention for up-sampling is explained using FIGS. 9–11, for better understanding of the invention the basic principle for down-sampling on which the invention builds, and which is the subject of non-published DE 101 02 166 A1, will first be explained.

Figure 1:
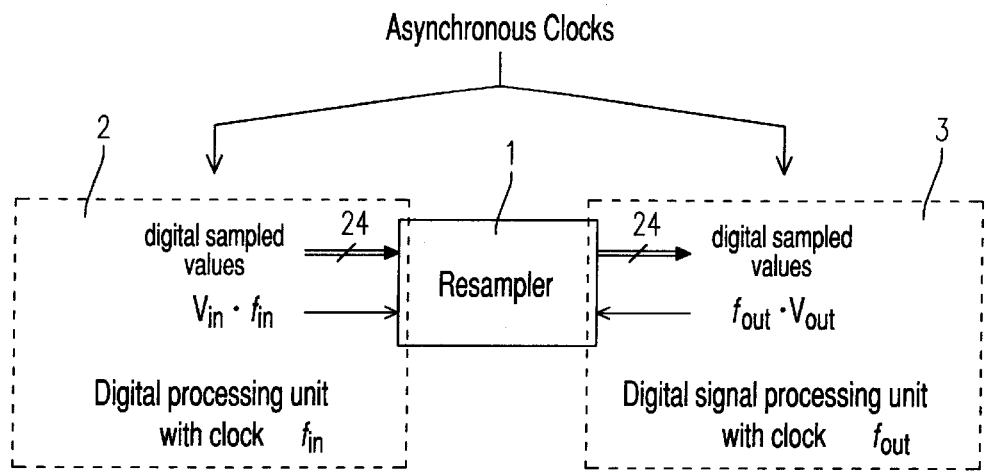
FIG. 1 is a schematic representation of a resampler for down-sampling.

FIG. 1 shows the basic principle of a resampler 1 on which the invention is based. A first digital signal processing unit 2 operating with a clock $f_{in}$ and a second digital signal processing unit 3 operating with a clock $f_{out}$ are connected to the resampler 1. The first digital signal processing unit 2 generates digital sampled values, for example with a width of 24 bits, which are fed to the resampler 1. Moreover, the resampler (sampling rate converter) is provided with the clock $v_{in} \cdot f_{in}$ from the first digital signal processing unit 2 and the clock $v_{out} \cdot f_{out}$ from the second digital signal processing unit 3. $v_{in}$ and $v_{out}$ are integer, or whole-number, multiples and can be equal to 1. The clocks $f_{in}$ and $f_{out}$ are in general asynchronous and have an arbitrary ratio to one another that is in general not an integer. The resampler 1 has the task of converting the digital sampled values of the first digital signal processing unit 2 operating with the clock $f_{in}$ into digital sampled values of the second digital signal processing unit 3 operating with the clock $f_{out}$. In the case that $f_{out}$ is smaller than $f_{in}$, this involves down-sampling. In the case that $f_{out}$ is larger than $f_{in}$, this involves up-sampling.

Figure 2:
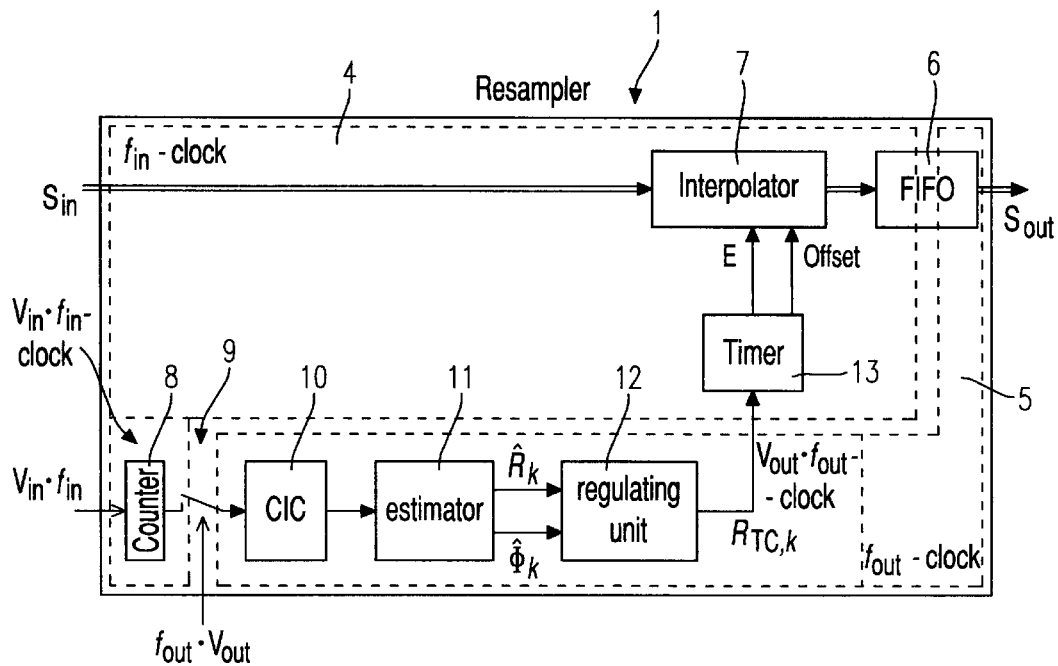
FIG. 2 is a block diagram of a resampler for down-sampling.
Figure 8:
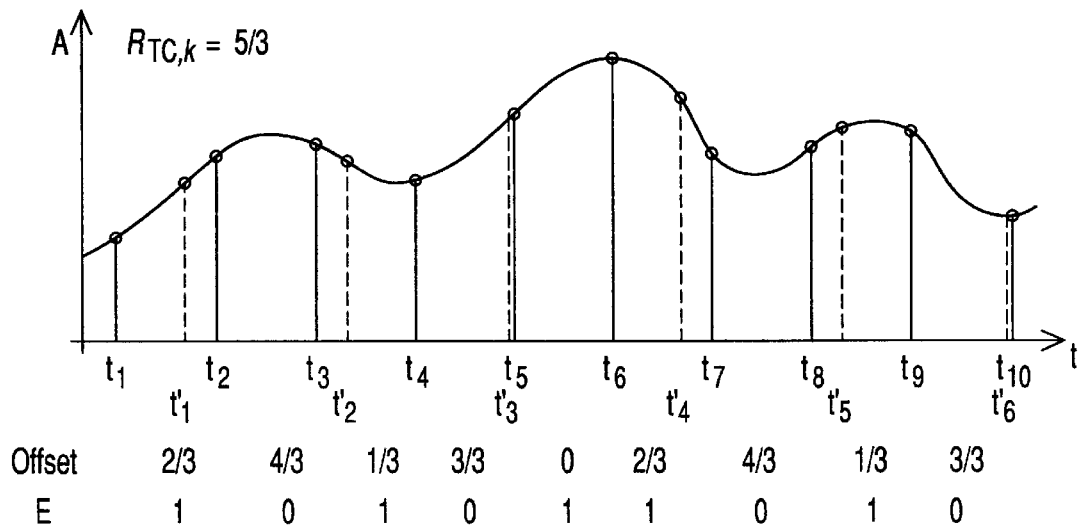
FIG. 8 is a diagram explaining a method of operation of the timing control shown in FIG. 4.

FIG. 2 shows an embodiment of the resampler 1 for down-sampling. A first block 4 of the resampler 1 works at the input clock $f_{in}$, while a second block 5 of the resampler 1 works at the output clock $f_{out}$. The digital input signal string $s_{in}$ supplied to the resampler 1 is supplied at the clock rate $f_{in}$ to an interpolator 7. An interpolation to generate the sampled values of the output signal string $s_{out}$ at sampling times corresponding to the output-sampling rate $f_{out}$ is performed in the interpolator 7. This is illustrated in FIG. 8. The sampled values A at the sampling times $t_1, t_3, \ldots t_{10}$ correspond to the input signal string $s_{in}$, while the sampled values A at the sampling times $t'_1, t'_2, \ldots t'_6$ correspond to the output signal string $s_{out}$.

In the illustrated case of down-sampling, the interpolator 7 is followed by a buffer store 6 that in the embodiment is a FIFO (first-in-first-out). In particular, the buffer store 6 serves during a transient phase to buffer the sampled values generated by the interpolator 7 that are taken out at the output of the buffer store 6 at the clock $f_{out}$. The goal of the present invention is to keep the fill level of the buffer store 6 exactly constant and to avoid variations in the fill level of the buffer store 6. The interpolator 7 is thus not regulated on the basis of fill level detection of the buffer store 6 as in the prior art, since such regulation can only be initiated when the fill level of the buffer store 6 has changed by at least 1. Instead, regulation is based on an estimation of the sampling rate ratio $R=f_{in}/f_{out}$ and an additional estimation of the phase angle $\phi$ of the output-sampling rate $f_{out}$ relative to the input-sampling rate $f_{in}$.

In order to determine the sampling rate ratio R, the input-sampling rate $f_{in}$ is fed to a counter 8 whose output is sampled at a sampling element 9 at the output-sampling rate $f_{out}$. The signal thus produced passes through a first-order cascaded integrator-comb filter (CIC filter) 10 in this example. This CIC filter 10 is followed by an estimator 11 to estimate the sampling rate ratio R and the phase angle $\phi$. The estimator 11 evaluates each set of N sampled values, and at the end of each such observation interval of length N generates an estimate $R_k$ for the sampling rate ratio $f_{in}/f_{out}$ and for the phase $\phi_k$ for the phase angle of the output clock $f_{out}$. These estimates are fed to a regulating unit 12 which generates a control signal $R_{TC,k}$ therefrom. This control signal $R_{TC,k}$ is fed to a timing control unit 13 that generates a time-shift-signal Offset that characterizes the sampling times $t'_1, t'_2, \ldots t'_6$ of the output signal string $s_{out}$ relative to the sampling times $t_1, t_2, \ldots t_{10}$ of the input signal string $s_{in}$, and generates an enable signal E that identifies whether or not a sampling time of the output signal string $s_{out}$ is present during a specific sampling interval of the input signal string $s_{in}$.

The individual elements of the resampler 1 shown in FIG. 2 are described in detail below.

Figure 3:
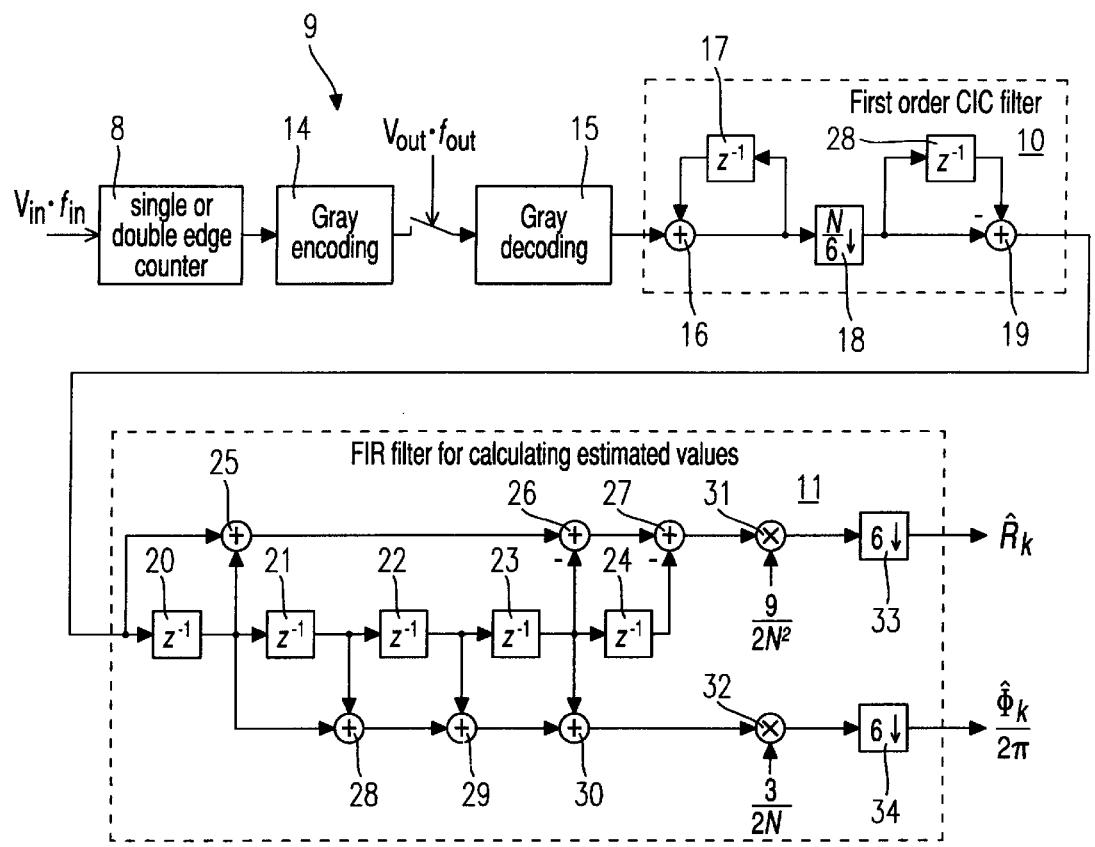
FIG. 3 is a block diagram of a detailed section of the resampler of FIG. 2 for determining a sampling rate ratio and a phase angle for down-sampling.

FIG. 3 shows a block diagram of the elements for obtaining the sampling rate ratio R, the CIC filter 10 and the estimator 11.

In the case of down-sampling illustrated in FIG. 2, the input-sampling rate $f_{in}$ is fed to the counter 8, which can be structured as a single or double edge counter. The count values from the counter 8 are fed to a Gray encoder 14, which performs a Gray encoding of the count values. Gray encoding has the known property that only one respective bit changes during an increment or decrement. An error in a subsequent sampling in the sampling element 9 at the output-sampling rate $f_{out}$ is thus a maximum of 1 bit. The Gray encoding is reversed in the Gray decoder 15 that follows. The Gray encoder 14 and the Gray decoder 15 are optional and can also be omitted. The sampling rate ratio can also be determined by means other than a counter-sampler.

In the embodiment illustrated, the output signal of the Gray decoder 15 is fed to the first-order CIC filter 10. In a first stage, including an adder 16 and a delay element 17, the sampled values are continuously totaled. In a sampling converter 18, the sampling rate in the embodiment is decreased by a factor of 6, that is only every sixth value of the output of the adder 16 is selected for further processing. In a second stage, including a subtracter 19 and a delay element 28, the first value of each block of length N/6 is subtracted from the last value, which is to say that the values at the output of the CIC filter 10 represent the blockwise totals of respective N/6 sampled values. These blockwise total values are fed to the estimator 11. N represents the length of the intended observation interval of the estimator 11.

The estimator 11 includes of a chain of several delay elements 20, 21, 22, 23 and 24. Selected initial, intermediate and final values of this delay element chain 20–24 are fed to adders 25, 26 and 27 for calculating the estimated values for the sampling rate ratio and to further adders 28, 29 and 30 for calculating the estimated values for the phase. Appropriate scaling is performed in multipliers 31 and 32 before a reduction of the sampling rate by the remaining value 6 takes place in a respective sampling converter 33 or 34 so that an estimated value $R_k$ for the sampling rate ratio, and an estimated value normalized to $2\pi$ for the phase $\phi_k/2\pi$, are available at the output of the estimator 11 after each observation interval of N input values.

The precise method of operation of the estimator shown in FIG. 3 is described in detail in patent application DE 100 39 666 A1 with the same assignee and the same inventor. The entire content of this patent application DE 100 39 666 A1 is incorporated by reference in the present application.

Figure 4:
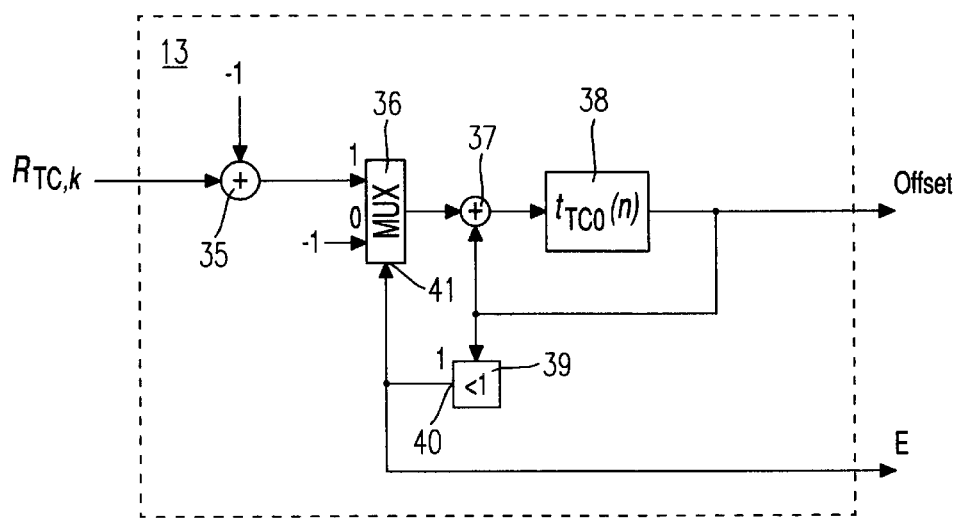
FIG. 4 is a block diagram of a timing control unit of the resampler in FIG. 2.

FIG. 4 shows a block diagram of the timing control unit 13. The regulating unit 12 produces a control signal $R_{TC,k}$ from the estimated values of the sampling rate ratio $R_k$ and of the phase $\phi_k$ in a manner that will be described in detail using FIG. 5, which control signal is fed to the timing control unit 13. The control signal $R_{TC,k}$ is reduced by one in an adder 35. The task of the timing control unit 13 is to provide the interpolator 7 with a time-shift-signal (Offset) that characterizes the sampling times $t'_1, t'_2, \ldots t'_6$ of the output signal string $s_{out}$ relative to the sampling times $t_1, t_2, \ldots t_{10}$ of the input signal string $s_{in}$. In this regard, the sampling period of the input signal string $s_{in}$ in the embodiment is normalized to one. In the case of a different normalization, the appropriate normalization quantity would be subtracted instead of 1. In addition, the control unit 13 generates an enable signal E, which indicates to the interpolator 7 whether a sampling time of the output signal string $s_{out}$ is present during the next sampling period of the input signal string $s_{in}$.

The output of the adder 35 is connected to a switching device (multiplexer MUX) 36. When the switching device 36 receives a logical "1" at its switching input 41, it connects its output to the adder 35. Otherwise its output is connected to the other input, which is continuously supplied with the value −1. The output of the switching device 36 is connected to an adder 37. The output of the adder 37 is connected to a delay element 38 that shifts each of the digital values of the input signal string $s_{in}$ by one sampling period $t_{TC0}(n)$, for example $t_2-t_1$. The output of the delay element 38 is connected to a second input of the adder 37 and to a detector 39. The detector 39 determines whether the current output value of the delay element 38 is greater than or less than 1. If the current output value of the delay element 38 is less than 1, the detector 39 produces a logical "1" at its output 40; otherwise it produces a logical "0". Hence if the current output value of the delay element 38 (register) is less than 1, the value $R_{TC,k}-1$ is applied to the input of the adder 37; otherwise the value −1 is applied to the input of the adder 37 via the switching element 36. The output values of the delay element 38 constitute the time-shift-signal Offset, whereas the output values of the detector 39 constitute the enable signal E.

The method of operation of the timing control unit 13 shown in FIG. 4, and that of the interpolator 7, are described below with reference to FIG. 8. FIG. 8 shows a signal of the amplitude A, which is sampled in accordance with the input signal string $s_{in}$ at times $t_1, t_2, t_3, t_4, t_5, t_6, t_7, t_8, t_9$ and $t_{10}$. According to resampling in the resampler 1, the signal is sampled at times $t'_1, t'_2, t'_3, t'_4, t'_5$ and $t'_6$. The time positions of the sampling times $t'_1, t'_2, \ldots t'6$ of the output signal string $s_{out}$ relative to the sampling times $t_1, t_2, \ldots t_{10}$ of the input signal string $s_{in}$ is indicated to the interpolator 7 by the timing control unit 13 by means of the time-shift-signal Offset and the enable signal E.

In the example of FIG. 8, one proceeds from the assumption that the control signal $R_{TC,k}=5/3$. The control signal $R_{TC,k}$ is essentially the sampling rate ratio $R=f_{in}/f_{out}$ that is regulated on the basis of the phase estimate in a manner that will be described in detail using FIGS. 5 through 7. It is further assumed that the starting value in the delay element (register) 38 for the time-shift-signal Offset=2/3. Since 2/3<1, the enable signal E=1. For the interpolator 7 this means that, at a sampling time $t'_1$ that is 2/3 of a sampling period of the input signal string $s_{in}$ later than the time $t_1$, a sampled value of the output signal string $s_{out}$ must be generated by interpolation.

The switching device 36 connects the input of the adder 37 with the adder 35 so that the value $R_{TC,k}-1=2/3$ is added to the register state of the delay element (register) 38 and the value Offset=4/3 now appears at the output of the delay element (register) 38. Since 4/3>1, the output of the detector 39 is now "0", and because of this state of the enable signal E=0, the interpolator 7 performs no interpolation between $t_2$ and $t_3$. On the following clock, as a result of the logical state "0" of the output of the detector 39, −1 is applied to the input of the adder 37 and the signal Offset at the output of the delay element (register) 38 becomes Offset=1/3. Since 1/3<1, the enable signal becomes E=1. The interpolator 7 thus performs an interpolation at a position shifted by 1/3 from the time $t_3$ of the sampling period of the input signal string $S_{in}$, hence at the position $t'_2$ in FIG. 8, to generate the next value of the output signal string $S_{out}$.

On the next clock, the value $R_{TC,k}-1=2/3$ is again applied to the adder 37 so that the output of the delay element (register) has the value 3/3=1. The output of the detector 39 is hence "0", and the enable signal E=0, so no interpolation takes place between the times $t_4$ and $t_5$. On the next clock, −1 is applied to the input of the adder 37 and the output of the delay element (register) 38 becomes 0. Since the enable signal E is set to "1" by the detector 39, the next interpolation then takes place at time $t'_3=t_5$. The sequence continues as shown in FIG. 8. In the timing control unit 13, $R_{TC,k}$ is always used for generating $N/V_{out}$ output values.

The structure and operation of an embodiment of the regulating unit 12 are described in more detail below using FIGS. 5 through 7.

Figure 5:
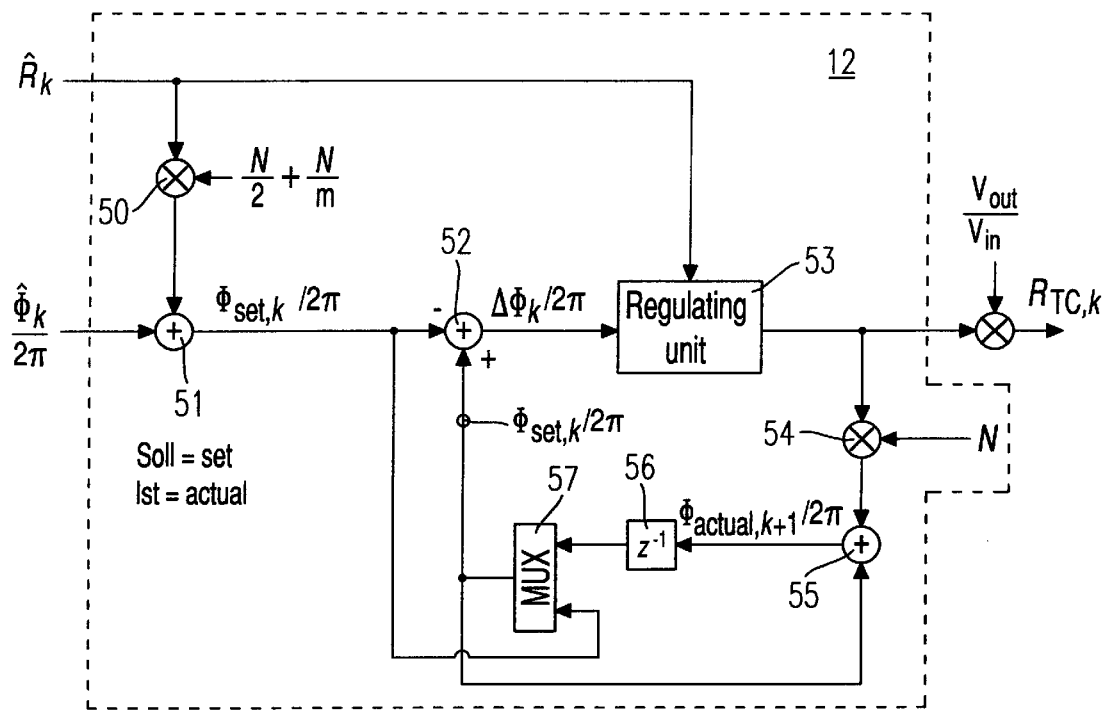
FIG. 5 is a block diagram of a regulating device of the resampler in FIG. 2.

FIG. 5 shows an embodiment of the regulating unit 12. After each observation interval, the regulating unit 12 is supplied with an estimated value for the sampling rate ratio $R_k$ and an estimated value normalized to $2\pi$ for the phase $\phi_k/2\pi$. The index k indexes the observation intervals that are illustrated in FIG. 7. In the example shown in FIG. 7, each observation interval is of six sampled values on the clock $f_{out}$ of the output signal string $S_{out}$. In the embodiment of the estimating unit 11 shown in FIG. 3, the estimation takes place at the midpoint of each observation interval. However, an estimate is needed for the regulating unit at the start of the next observation interval. Consequently, a phase offset of $N/2 \cdot R_k$ is added to the estimated value $\phi_k/2\pi$, which is illustrated in FIG. 7 in the center row.

In the embodiment shown in FIG. 5, an additional phase offset of $N/m \cdot R_k$ is added, where m can be m=12, for example. The purpose of this additional offset is to ensure, even in the case of the largest possible regulator deviation that can be expected, that the resulting desired phase $\phi_{set,k}$ does not lie before the beginning of the next observation interval. In the embodiment depicted, the aforementioned phase shift is produced by a multiplier 50, which can also be implemented as a bit shift operation (bit shifter) if the phase shift is chosen appropriately, and an adder 51.

The phase $\phi_{set,k}/2\pi$, normalized to $2\pi$, is compared with the actual phase $\phi_{actual,k}/2\pi$ at the beginning of the next observation interval. The deviation $\Delta\phi_k/2\pi$ is determined in a subtracter 52 and is supplied to a regulator 53. Also supplied to the regulator 53 are the estimated values for the sampling rate ratio $R_k$. The regulator 53 works in such a way that the control signal $R_{TC,k}$ produced at the output of the regulator 53 corresponds essentially to the sampling rate ratio $R_k$ estimated in the preceding observation interval, yet this is slightly modified, based on the controlled magnitude $\Delta\phi_k/2\pi$, in such a way that the control signal $R_{TC,k}$ achieves the result that, at the end of the observation interval to be regulated, the actual phase $\phi_{actual,k}$ agrees with the set-point phase $\phi_{set,k}$. Ideally, in the steady state of the regulator, $R_k$ agrees with the control signal $R_{TC,k}$.

The actual phase $\phi_{actual,k}$, normalized to $2\pi$, of the output signal string $S_{out}$ is formed in such a way that the control signal $R_{TC,k}$, which represents the actual sampling rate ratio used by the timing control unit 13, is multiplied by the observation duration N in a multiplier 54. Here, too, the multiplier 54 can be replaced by a bit shift operation (bit shifter) in order to avoid actual multiplication. In this way, the phase shift is determined during the kth observation interval and supplied to the adder 55, whose output is connected to a delay element 56 (register), which effects a shift by the length of one observation interval at a time. Except during initialization, which is described below, the switching element 57 is always switched such that its output is connected to the delay element 56. Consequently, the output of the delay element 56 is returned to one of the inputs of the adder 55. Since the output of the delay element (register) 56 represents the actual phase $\phi_{actual,k}$ at the start of the kth observation interval, the actual phase $\phi_{actual,k}$ at the beginning of the k+1th observation interval $\phi_{actual,k+1}/2\pi$ is calculated by adding the phase $\phi_{actual,k}$ at the beginning of the kth observation interval to the phase shift produced during the kth observation interval. The actual phase is thus continually updated by taking into account the phase shift occurring in the then-current observation interval.

At the start of the regulation, the actual phase is not known. Consequently, at the start of regulation during initialization, the output of the adder 51 is connected to the +input of the subtracter 52 through the switching element (multiplexer MUX) 57, so that the controlled magnitude $\Delta\phi_k/2\pi$ is initially 0 because of the identity of the input signals of the subtracter 52.

Figure 6:
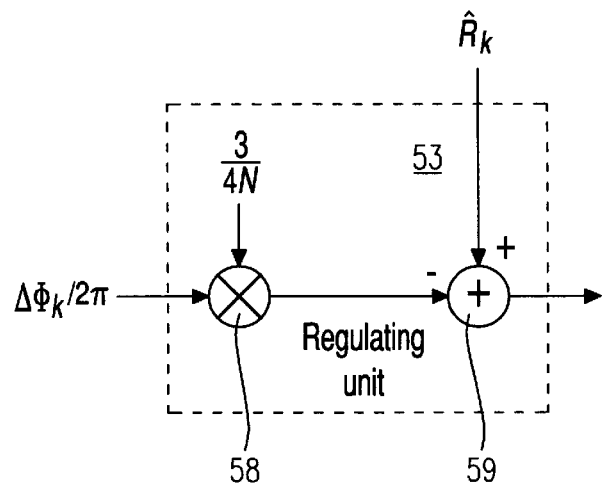
FIG. 6 is a detailed representation of the regulator of the regulating device shown in FIG. 5.

FIG. 6 shows an embodiment of the regulator 53. In this embodiment, the regulator 53 takes the form of a proportional controller, that is the change made in the estimated sampling rate ratio $R_k$ is proportional to the controlled magnitude $\Delta\phi_k/2\pi$, with a proportionality factor in the embodiment shown being 3/4N. The proportionality factor and the controlled magnitude $\Delta\phi_k/2\pi$ are supplied to a multiplier 58, which can be implemented as a bit shift operation (bit shifter) if the proportionality factor is chosen appropriately. The actual regulation is accomplished by means of a subtracter 59, to which are fed the output of the multiplier 58 and the estimated values of the sampling rate ratio $R_k$.

Figure 7:
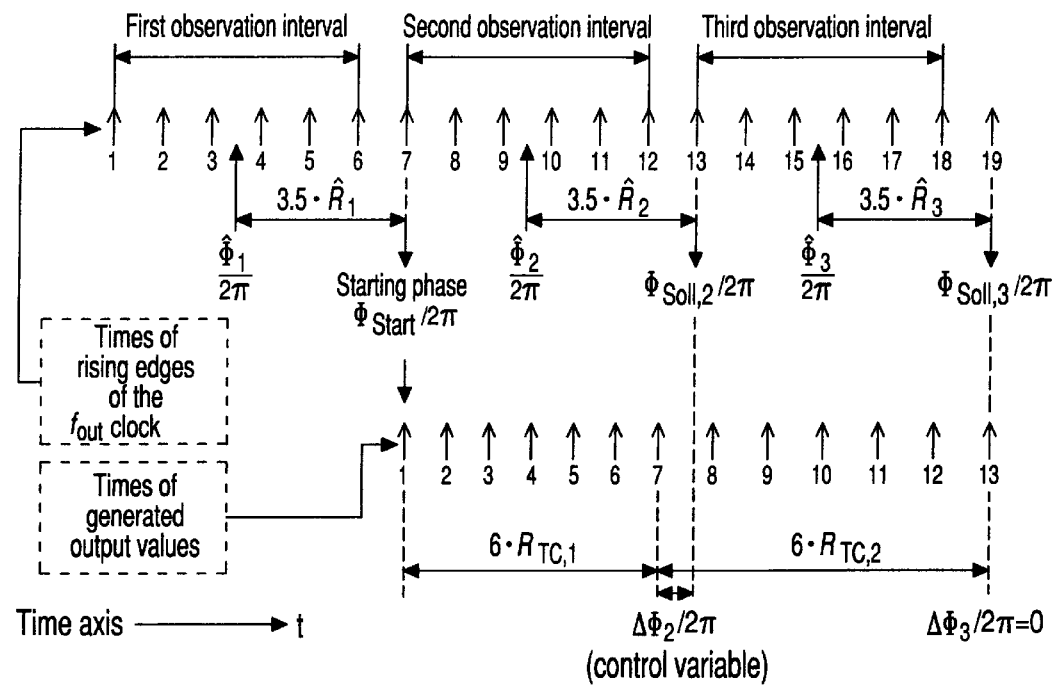
FIG. 7 is a diagram explaining a method of operation of the regulating device shown in FIG. 5.

The method of operation of the regulating unit 12 shown in FIG. 5 is described in detail using FIG. 7. In the first row in FIG. 7, the sampling times of the output signal string $S_{out}$, which are represented for example by the rising edges of the $f_{out}$ clock, are illustrated by arrows. In the second line, it is respectively indicated that the estimating unit 11 determines an estimated value normalized to $2\pi$ for the phase $\Delta\phi_k/2\pi$ for the respective midpoint of each observation interval. In order to obtain the phase for the output clock $f_{out}$ at the beginning of each subsequent observation interval, the phase in this example must be respectively shifted by $3.5 \cdot R_k$. This results in the setpoint phase $\phi_{set,k}$ at the start of the next observation interval.

In the first observation interval, no regulation can be performed yet since the estimates $R_1$ and $\phi_1$ are determined for the first time during this observation interval. In the second observation interval, the starting phase $\phi_{start}/2\pi$ is established by the switching device (multiplexer) 57, which is used to initialize the actual phase of the regulating device 12. At the end of the second observation interval, the controlled magnitude $\Delta\phi_2/2\pi$, which represents the deviation of the actual phase from the setpoint phase at the end of the second observation interval, can be determined for the first time. In the example illustrated in FIG. 7, the clock $f_{out}$ during the second observation interval was too long. The clock $f_{out}$ is reduced during the third observation interval such that ideally the actual phase agrees exactly with the setpoint phase at the end of the third observation interval.

The regulating unit of this invention continuously corrects the sampling rate ratio, especially when there is a change in the input-sampling rate $f_{in}$ or the output-sampling rate $f_{out}$. A change in the fill level of the buffer store (FIFO) 6 can be avoided in the steady state of the regulator, so that no relatively large changes in the group propagation delay through the resampler 1 occur.

Now that the resampler concept for the case of down-sampling on which the present invention is based has been described, the special features of this invention that are involved in modifying the concept for up-sampling will be described using FIGS. 9–11, which describe an embodiment of this invention. The components of the resampler 1 that are not shown in FIGS. 9–11 are identical to the embodiment of FIGS. 1–6.

Figure 9:
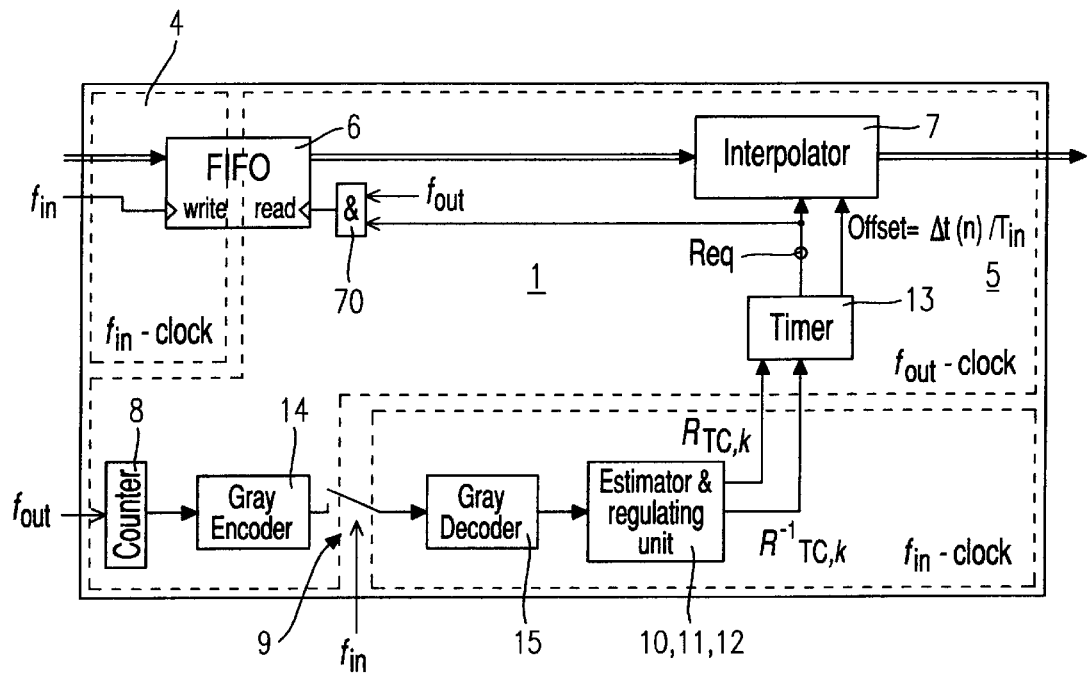
FIG. 9 is a block diagram of an inventive resampler for up-sampling.

FIG. 9 shows a block diagram of the resampler 1 of this invention. Elements that have already been described using FIGS. 2 and 3 are labeled with matching reference symbols so that a repeated description is not necessary.

In contrast to the down-sampling shown in FIG. 2, the buffer store (FIFO) 6 is arranged ahead of the interpolator 7 in the case of the up-sampling according to the invention. A further difference is that the timing control unit 13 now does not transmit enable signals E, but instead transmits request signals Req to the interpolator 7 and an AND logic gate 70. The AND logic gate 70 transmits a READ signal to the READ input of the buffer store 6 when a new input value is requested by the timing control unit 13 via the request signal Req and a rising edge of the output clock $f_{out}$ is present at the same time. A further difference from down-sampling is that the system clock for the timing control unit 13 and the interpolator 7 is the output clock $f_{out}$, which is higher in this case. In contrast, the counter 8 receives the output clock $f_{out}$ instead of the input clock $f_{in}$ and is sampled with the input clock $f_{in}$ at the sampling element 9. The CIC filter 10, the estimator 11 and the regulating unit 12 likewise operate with the sampling input clock $f_{in}$.

Essentially the same structures can be used that have already been described using FIGS. 3–6. In the embodiment described below, it is assumed that the resampler 1 is provided with the input-sampling rate $f_{in}$ as an input clock and not a multiple $v_{in}$ thereof, as well as the output-sampling rate $f_{out}$ as output clock and not a multiple $v_{out}$ thereof. Nonetheless, this does not restrict its generality, but only simplifies the following discussion of the embodiment.

Moreover, due to the exchange of the input-sampling rate $f_{in}$ with the output-sampling rate $f_{out}$ the estimator 11 does not produce estimates for the sampling rate ratio $R=f_{in}/f_{out}$, but instead produces estimates for the inverse sampling rate ratio $R^{-1}=f_{out}/f_{in}=T_{in}/T_{out}$, where $T_{in}$ is the input sampling period and $T_{out}$ is the output sampling period. In a similar manner, the regulating unit, structured for example as shown in FIG. 5, produces an inverse control signal $R^{-1}{}_{TC,k}$ that is the inverse of the control signal $R_{TC,k}$. The control signal $R_{TC,k}$ and the inverse control signal $R^{-1}{}_{TC,k}=1/R_{TC,k}$ are supplied to the timing control unit 13, an embodiment of which is shown in FIG. 11.

In essence, the structure already described using FIG. 4 can be used for the timing control unit 13 with some modifications of this invention. The time shifts $t_{mod}(n)/T_{out}$ shown in FIG. 10 were generated at the Offset output of the timing control unit 13 shown in FIG. 4. This time shift $t_{mod}(n)/T_{out}$ specifies the time shift of a sampling time $t'_n$ of an output value of the output signal string $s_{out}$ relative to the next sampling time $t_{i+1}$ of the input values of the input signal string $s_{in}$, normalized to the sampling period $T_{out}$ of the output signal string $s_{out}$. This is a consequence of the fact that in the resampler 1 shown in FIG. 9, as compared to the resampler 1 shown in FIG. 2, the input-sampling rate $f_{in}$ has been exchanged for the output-sampling rate $f_{out}$. As is discussed with the aid of FIG. 8, however, the interpolator 7 requires the time shift $\Delta t(n)/T_{in}$, namely the time shift of the sampling time $t'_n$ of the output signal string $s_{out}$ relative to the preceding sampling time $t_i$ of the input signal string $s_{in}$, normalized to the sampling period $T_{in}$ of the input signal string $s_{in}$. Thus, according to this invention, a corresponding conversion calculation must be performed.

Figure 10:
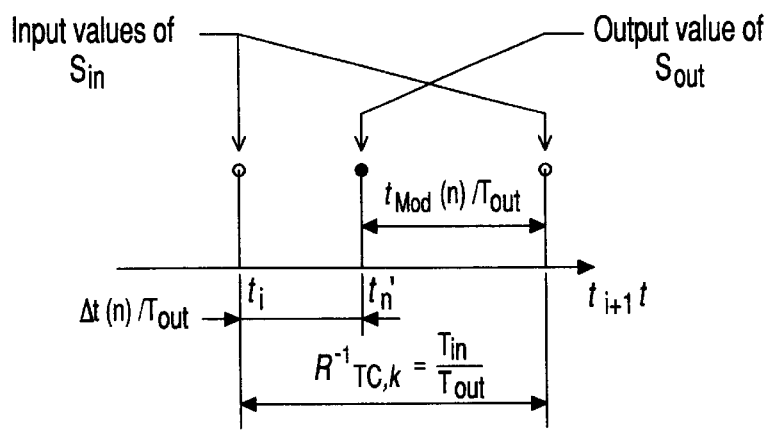
FIG. 10 is a diagram explaining the method of operation of the timing control unit shown in FIG. 11 of the inventive resampler for up-sampling.

FIG. 10 shows that, on a time scale normalized to the sampling period $T_{out}$ of the output signal string $s_{out}$, the distance between two input values of the input signal string $s_{in}$ is equal to the inverse control signal $R^{-1}{}_{TC,k}=T_{in}/T_{out}$ where $T_{out}=1$. Consequently, the following conversion for the time shift $\Delta t(n)/T_{out}$ results:

$$\Delta t(n)/T_{out}=R^{-1}{}_{TC,k}-t_{mod}(n)/T_{out}$$

Figure 11:
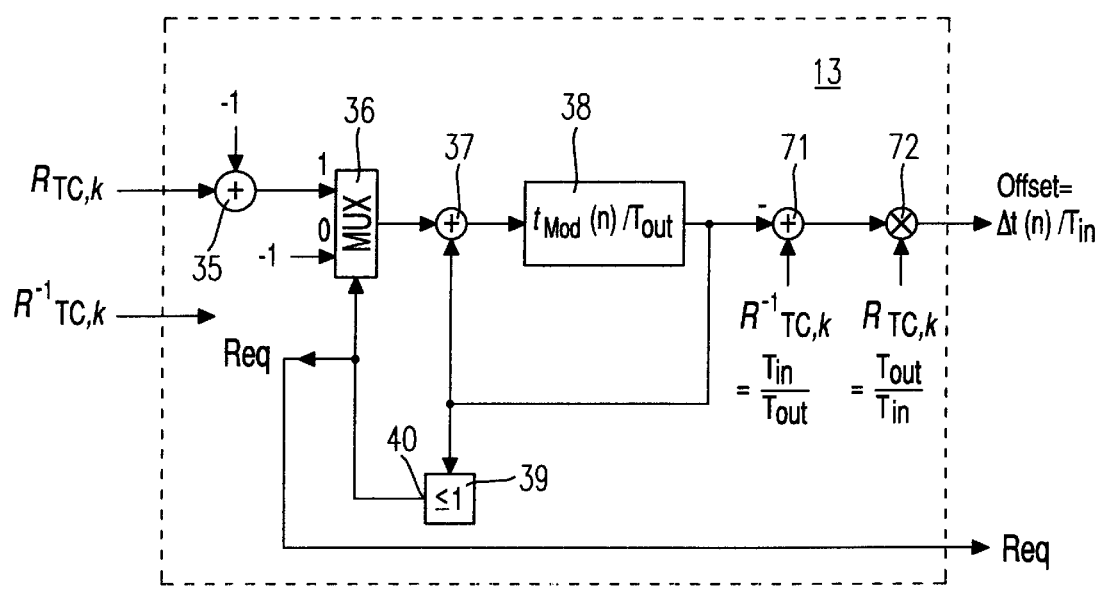
FIG. 11 is a block diagram of the timing control unit of the inventive resampler for up-sampling.

As is shown in FIG. 11, this conversion can be performed with a subtracter 71, where the +input of the subtracter is supplied with the inverse control signal $R^{-1}{}_{TC,k}$ and the −input of the subtracter 71 is supplied with the output of the delay element 38.

As already mentioned, the interpolator 7 requires information on the size of the shift $\Delta t(n)/T_{in}$ of the next output value to be interpolated of the output signal string $s_{out}$ relative to the preceding input value of the input signal string $S_{in}$ with respect to the sampling period $T_{in}$, and not with respect to the sampling period $T_{out}$. The conversion of the time shift $\Delta t(n)/T_{out}$ to the time shift $\Delta t(n)/T_{in}$ can be performed via multiplication by the control signal $R_{TC,k} = T_{out}/T_{in}$. To this end, a multiplier 72 is provided following the subtracter 71 in the embodiment shown in FIG. 11.

It should also be mentioned that as a result of exchanging the input-sampling rate $f_{in}$ with the output-sampling rate $f_{out}$, the interval boundaries have also been shifted so that the detector 39 must determine whether the output value of the delay element 38 is less than or equal to (and not, as in FIG. 4, only less than) the sampling period $T_{out}$ scaled to 1 in the embodiment. The signal at the output 40 of the detector 39 then constitutes the request signal Req that is supplied to the interpolator 7 and the AND logic gate 70.

Moreover, it should be noted that the subtraction performed in the subtracter 71 in the embodiment shown in FIG. 11 can also be performed in such a manner that the detector 39 does not determine whether the output of the delay element 38 is less than or equal to 1, but instead determines whether the output is greater than or equal to $R^{-1}_{TC,k}1$. In this way, the subtracter 71 can be dispensed with.

The invention is not limited to the embodiment shown. In particular, the estimating unit 11 can also be configured in a manner different from that shown in FIG. 3. Other implementations of the time control unit 13 than that shown in FIG. 11 are also conceivable.

I claim:

1. Device for converting a digital input signal string ($S_{in}$) with an input-sampling rate ($f_{in}$) into a digital output signal string ($S_{out}$) with an output-sampling rate ($f_{out}$) that is higher than the input-sampling rate ($f_{in}$), comprising:

an estimating unit (11) that estimates the sampling rate ratio ($R_k$) between the input-sampling rate ($f_{in}$) and the output-sampling rate ($f_{out}$), a regulating unit (12) that is connected to the estimating unit (11) and which generates a control signal ($R_{TC,k}$) as a function of the estimated sampling rate ratio ($R_k$), a timing control unit (13), which initially determines, from the control signal ($R_{TC,k}$) the time shift $t_{mod}(n)/T_{out}$ of each sampling time ($t'_n$) of the output signal string ($S_{out}$) relative to the next sequential sampling time ($t_{1+}$) of the input signal string ($S_{in}$), and then establishes therefrom the time shift ($\Delta t(n)/T_{out}$) of the sampling time ($t'_n$) of the output signal string ($S_{out}$) relative to the preceding sampling time ($t_i$) of the input signal string ($S_{in}$), and an interpolator (7) that interpolates, from the sampling times ($t'_n$) determined in the timing control unit (13), the input signal string ($S_{in}$) for producing the output signal string ($S_{out}$).

2. Device according to claim 1, wherein the timing control unit (13) includes an adder (37) whose output is connected to an input of a delay element (38) and whose first input is connected to the output of the delay element (38), wherein the output of the delay element (38) is connected to a detector (39), which determines whether the output value of the delay element (38) is less than or equal to a scaled sampling period of the output signal string ($S_{out}$), and wherein the control signal ($R_{TC,k}$), which has been reduced by the scaled sampling period, is fed to the second input of the adder (37) when the detector (39) determines that the output value of the delay element (38) is less than or equal to the scaled sampling period of the output signal string ($S_{out}$), and the scaled sampling period is supplied to the second input of the adder (37) when the detector (39) determines that the output value of the delay element (38) is greater than the scaled sampling period of the output signal string ($S_{out}$).

3. Device according to claim 2, wherein the delay element (38) is followed by a subtracter (71) that subtracts the output values of the delay element (38) from an inverse control signal ($R^{-1}_{TC,k}$).

4. Device according to claim 1, wherein the timing control unit (13) first determines the time shift ($\Delta t(n)/T_{out}$) of the sampling time ($t'_n$) of the output signal string ($S_{out}$) normalized to the sampling period ($T_{out}$) of the output signal string ($S_{out}$), and then renormalizes to the sampling period ($T_{in}$) of the input signal string ($S_{in}$).

5. Device according to claim 3, wherein a multiplier (72) follows the delay element (38) and the subtracter (71), and said multiplier multiplies the output values of the delay element (38) and the subtracter (71) by the control signal ($R_{TC,k}$).

6. Device according to claim 1, wherein the estimating unit (11) estimates a setpoint phase ($\phi_{set,k}$) of the output signal string ($S_{out}$) as well as the sampling rate ratio $R_k$.

7. Device according to claim 6, wherein the regulating unit (12) also compares the actual phase ($\phi_{actual,k}$) of the output signal string ($S_{out}$) to the setpoint phase ($\phi_{set,k}$) of the output signal string ($S_{out}$) and also generates a control signal ($R_{TC,k}$) as a function of a deviation ($\Delta\phi_k$) of the actual phase ($\phi_{actual,k}$) from the setpoint phase ($\phi_{set,k}$).

8. Method for converting a digital input signal string ($S_{in}$) with an input-sampling rate ($f_{in}$) into a digital output signal string ($S_{out}$) with an output-sampling rate ($f_{out}$) that is higher than the input-sampling rate ($f_{in}$), having the following process steps:

estimating (11) the sampling rate ratio ($R_k$) between the input-sampling rate ($f_{in}$) and the output-sampling rate ($f_{out}$), generating a control signal ($R_{TC,k}$) as a function of the estimated sampling rate ratio ($R_k$), determining from the control signal ($R_{TC,k}$) a time shift $t_{mod}(n)/T_{out}$ of each sampling time ($t'_n$) of the output signal string ($S_{out}$) relative to the next sequential sampling time ($t_{i+1}$) of the input signal string ($S_{in}$), establishing the time shift ($\Delta t(n)/T_{out}$) of the sampling time ($t'_n$) of the output signal string ($S_{out}$) relative to the preceding sampling time ($t_i$) of the input signal string ($S_{in}$) from the previously determined time shift $t_{mod}(n)/T_{out}$ relative to the next sequential sampling time ($t_{i+1}$), and interpolating (7), from the sampling times ($t'_1, t'_2, \ldots t'_6$) determined in a timing control unit (13), the input signal string ($S_{in}$) to produce the output signal string ($S_{out}$).

9. Method in accordance with claim 8, wherein the time shift ($\Delta t(n)/T_{out}$) of the sampling time ($t'_n$) of the output signal string ($S_{out}$) is first determined normalized to the sampling period ($T_{out}$) of the output signal string ($S_{out}$), and is then renormalized to the sampling period ($T_{in}$) of the input signal string ($S_{in}$).

10. Method in accordance with claim 8, wherein the setpoint phase ($\phi_{set,k}$) of the output signal string ($S_{out}$) is estimated in addition to the sampling rate ratio ($R_k$).

11. Method in accordance with claim 10, wherein the actual phase ($\phi_{actual,k}$) of the output signal string ($S_{out}$) is additionally compared to the setpoint phase ($\phi_{set,k}$) of the output signal string ($S_{out}$) and the control signal ($R_{TC,k}$) is additionally generated as a function of the deviation ($\Delta\phi_k$) of the actual phase ($\phi_{actual,k}$) from the setpoint phase ($\phi_{set,k}$).

* * * * *